US010784639B2

(12) United States Patent
Schaper

(10) Patent No.: US 10,784,639 B2
(45) Date of Patent: Sep. 22, 2020

(54) LOOP BRIDGE

(71) Applicant: Phoenix Contact GmbH & Co. KG, Blomberg (DE)

(72) Inventor: Elmar Schaper, Lügde (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 45 days.

(21) Appl. No.: 15/780,110

(22) PCT Filed: Nov. 15, 2016

(86) PCT No.: PCT/EP2016/077677
§ 371 (c)(1),
(2) Date: May 30, 2018

(87) PCT Pub. No.: WO2017/093010
PCT Pub. Date: Jun. 8, 2017

(65) Prior Publication Data
US 2018/0351312 A1 Dec. 6, 2018

(30) Foreign Application Priority Data
Nov. 30, 2015 (DE) .................. 10 2015 120 788

(51) Int. Cl.
*H05K 3/40* (2006.01)
*H01R 12/72* (2011.01)
(Continued)

(52) U.S. Cl.
CPC ........... *H01R 31/08* (2013.01); *H01R 9/2675* (2013.01); *H05K 3/40* (2013.01); *H01R 12/721* (2013.01); *H01R 13/035* (2013.01)

(58) Field of Classification Search
CPC ...... H01R 13/66; H01R 13/035; H01R 12/78; H01R 12/721; H01R 12/592; H01R 31/08;
(Continued)

(56) References Cited

U.S. PATENT DOCUMENTS 3,747,210 A    7/1973  Kroll
5,383,095 A *  1/1995  Korsunsky .......... H05K 3/3405
                                                       361/785
(Continued)

FOREIGN PATENT DOCUMENTS

CN        1238575 A    12/1999
CN      101223677 A     7/2008
(Continued)

OTHER PUBLICATIONS

Translate.pdf : Translation of Description for DE 102004002077. (Year: 2005).*

*Primary Examiner* — Edwin A. Leon
*Assistant Examiner* — Milagros Jeancharles
(74) *Attorney, Agent, or Firm* — Holland Hart LLP

(57) ABSTRACT

The present disclosure relates to a loop bridge for looping-through an electric signal, comprising: a first electric module comprising a first electrical connection terminal, wherein the electric signal loops through the first electric module to a second electric module comprising a second electrical connection terminal, wherein the first electrical connection terminal and the second electrical connection terminal each have a pressure piece: and a printed circuit board with a comb-like line structure. The comb-like line structure comprises: a first comb tine, wherein the first comb tine is configured to be inserted into the first electrical connection terminal, and wherein the first comb tine comprises a first metal support part configured to support the pressure piece of the first electrical connection terminal: and a second comb
(Continued)

tine electrically connected to the first comb tine, wherein the second comb tine is configured to be inserted into the second electrical connection terminal.

18 Claims, 4 Drawing Sheets

(51) Int. Cl.
*H01R 31/08* (2006.01)
*H01R 9/26* (2006.01)
*H01R 13/03* (2006.01)

(58) Field of Classification Search
CPC ........ H01R 31/085; H01R 4/363; H05K 1/11; H05K 1/111–116; H05K 2201/0394; H05K 2201/10295; H05K 2201/1031; H05K 2201/10318; H05K 2201/09009; H05K 2201/092; H05K 2201/0723; H05K 2201/0919; H05K 2201/095; H05K 2201/09554; H05K 2201/09563; H05K 2201/09627; H05K 2201/09645

See application file for complete search history.

(56) References Cited

U.S. PATENT DOCUMENTS

| | | | |
|---|---|---|---|
| 6,303,881 B1 | 10/2001 | Parker, Jr. et al. | |
| 6,475,038 B1 * | 11/2002 | Franck | H01R 4/363 |
| | | | 439/811 |
| 6,476,705 B1 * | 11/2002 | Betti | B60R 16/02 |
| | | | 337/161 |
| 7,476,113 B2 * | 1/2009 | Tamagawa | H01R 12/592 |
| | | | 439/189 |
| 9,755,406 B2 * | 9/2017 | Schaper | H01R 31/08 |
| 2007/0015417 A1 | 1/2007 | Caveney et al. | |
| 2013/0143420 A1 | 6/2013 | Light et al. | |
| 2018/0366894 A1 * | 12/2018 | Schaper | H01R 31/08 |

FOREIGN PATENT DOCUMENTS

| | | |
|---|---|---|
| DE | 10 2004 002 077 A1 | 8/2005 |
| DE | 10 2004 002077 A1 | 8/2005 |
| DE | 10 2013 114 651 A1 | 5/2015 |
| DE | 10 2014 117 868 A1 | 6/2016 |

* cited by examiner

LOOP BRIDGE

CROSS-REFERENCE TO RELATED APPLICATIONS

This application is a 371 national phase filing of International Application No. PCT/EP2016/077677, entitled "LOOPING BRIDGE", filed 15 Nov. 2016, which claims priority to German Patent Application No. 10 2015 120 788.5, entitled "SCHLEIFEBRÜCKE", filed 30 Nov. 2015.

BACKGROUND

The present disclosure relates to a loop bridge for looping-through an electric signal from a first electric module which has a first electrical connection terminal to a second electric module which has a second electrical connection terminal.

In automation technology, particularly in interface technology, electric signals are commonly looped through from a first electric module to a second electric module. For example, the electric signals are output by a voltage supply.

For the looping-through of the electric signals, electric connection lines with copper cores having, for example, a cross-sectional area of 1.5 mm2, are commonly used, wherein, at the ends of the copper cores, double core end sleeves are attached for the electric connection of the individual copper cores. Furthermore, a loop bridge for looping-through the electric signals can be used. A loop bridge for looping-through electric signals is described in the published document WO 2015/091001 A1.

Commonly, the respective electric modules have respective electrical connection terminals in which comb tines of the loop bridge or the core end sleeves can be clamped in each case with a contact force. For the transmission of the contact force to the comb tines or to the core end sleeves, standards commonly have to be satisfied, for example, the standard IEC 60947-7-1, section 7.1, or the standard VDE 0609, in particular sections 8.2 and 8.10 of the standard VDE 0609.

SUMMARY

The underlying aim of the disclosure is to create a loop bridge in which a contact force, which is exerted on the comb tine when a comb tine of the loop bridge is clamped in an electrical connection terminal, can be transmitted efficiently.

This aim is achieved by the subject matter having the features according to the independent claim. Advantageous examples of the disclosure are the subject matter of the figures, the description and the dependent claims.

The present disclosure is based on the finding that the contact force exerted on the comb tines can be transmitted or absorbed efficiently by a metal support part of the comb tine. In this manner, the contact force can be absorbed by the metal support part and thereby a load can be removed from an insulation material of a printed circuit board of the loop bridge.

According to an aspect of the disclosure, the aim is achieved by a loop bridge for looping-through an electric signal from a first electric module which has a first electrical connection terminal to a second electric module which has a second electrical connection terminal, wherein the first electrical connection terminal and the second electrical connection terminal each have a pressure piece, wherein the loop bridge comprises a printed circuit board with a comb-like line structure, wherein the comb-like line structure has the following features: a first comb tine and a second comb tine which are electrically connected together, wherein the first comb tine is insertable into the first electrical connection terminal, wherein the second comb tine is insertable into the second electrical connection terminal, wherein the first comb tine has a first metal support part for supporting the pressure piece of the first electrical connection terminal, and wherein the second comb tine has a second metal support part for supporting the pressure piece of the second electrical connection terminal. Thereby, the advantage is achieved that the contact force exerted on the respective comb tine by means of the pressure piece of the respective electrical connection terminal can be transmitted efficiently. Furthermore, a load can be removed from an insulation material of the printed circuit board of the comb tine in the area of the respective comb tine.

Furthermore, the loop bridge can have a plurality of first comb tines and the plurality of second comb tines, wherein the first comb tines and the second comb tines each are electrically connected in pairs, and wherein the respective comb tines each have a respective metal support part. For example, the plurality is 2, 3, 4, 5, 6, 7, 8, 9 or 10. Here, the plurality of electric signals can be looped through from a first electric module with the plurality of first electrical connection terminals to a second module with the plurality of second electrical connection terminals.

The respective electric module can be a sensor, an actuator or an electric device. Furthermore, the electric signal can be output by a current supply device or a voltage supply device. The electric signal can furthermore be a control signal. Furthermore, the respective electrical connection terminal can be a screw terminal or a spring terminal.

The printed circuit board can be a single-layer or multi-layer printed circuit board. For example, the printed circuit hoard is produced from an FR-4 printed circuit board material. The first comb tine and the second comb tine can be electrically connected to one another feedthrough an electric connection line. Here, the electric connection line can be arranged on the printed circuit board or between two successive printed circuit board layers of the printed circuit board.

According to an example, the respective comb tine can have a plurality of respective metal support parts. For example, the respective comb tine can have between 5 and 20 respective metal support parts.

In an advantageous example of the loop bridge, the first comb tine has a first aperture in which the first metal support part is disposed, and the second comb tine has a second aperture in which the second metal support part is disposed. Thereby, the advantage is achieved that the respective metal support part can be inserted efficiently in the respective comb tine.

The respective aperture can have a circular, elliptical, rectangular or square cross section. Furthermore, the respective aperture can be formed by a bore hole in the respective comb tine. For example, the respective aperture is formed by a bore hole having a diameter of 0.5 to 1.5 mm.

According to an example, the respective comb tine can have a plurality of respective apertures in which in each case a respective metal support part is disposed. For example, the respective comb tine has between 5 and 20 respective apertures.

In another advantageous example of the loop bridge, the respective aperture is arranged centrally in the respective comb tine. Thereby, the advantage is achieved that a mechanical stability of the respective comb tine can be increased.

In another advantageous example of the loop bridge, the respective aperture extends transversely to a transverse axis of the respective comb tine. Thereby, the advantage is achieved that the contact force of the pressure piece can be transmitted efficiently.

In another advantageous example of the loop bridge, the respective metal support part is a metal sleeve or a metal cylinder. Thereby, the advantage is achieved that the metal support part can be produced efficiently and cost effectively.

The metal sleeve or the metal cylinder can be manufactured out of copper. For example, the metal sleeve or the metal cylinder has an outer diameter of 0.5 to 1.5 mm.

In another advantageous example of the loop bridge, the respective metal support part is a respective feedthrough formed in the respective comb tine. Thereby, the advantage is achieved that the respective metal support part can be integrated particularly efficiently in the respective comb tine using a standard process of printed circuit board manufacturing technology.

The respective feedthrough can be formed by a metallized bore hole in the respective comb tine. For example, a diameter of the bore hole is 0.5 to 1.5 mm, and the bore hole is metallized with copper. Furthermore, the respective feedthrough can extend transversely to a transverse axis of the respective comb tine.

In another advantageous example of the loop bridge, the respective feedthrough is filled with an electrically conductive filler material. Thereby, the advantage is achieved that an electric conductivity and a mechanical stability of the respective feedthrough can be increased.

The electrically conductive filler material can be a cured metal paste. For example, the metal paste is a copper-resin compound or a silver-resin compound.

In another advantageous example of the loop bridge, the respective feedthrough is arranged centrally in the respective comb tine. Thereby, the advantage is achieved that a mechanical stability of the respective comb tine can be increased.

In another advantageous example of the loop bridge, the respective metal support part laterally engages around the respective comb tine at least partially, or the respective metal support part has a side wall which covers a side wall of the respective comb tine at least partially. Thereby, the advantage is achieved that an expensive aperture of the respective comb tine can be dispensed with. Thereby, furthermore, a mechanical stability of the respective comb tine can be increased.

In another advantageous example of the loop bridge, the respective metal support part is formed by a metal coating of the side wall of the respective comb tine. Thereby, the advantage is achieved that the respective metal support part can be provided particularly efficiently using a standard process of printed circuit board manufacturing technology.

The metal coating can form a metal contact surface arranged on a side of the respective comb tine. Furthermore, the metal coating can be a copper coating. For example, a thickness of the metal coating is 50 to 500 μm.

In another advantageous example of the loop bridge, the respective comb tine has, on the upper side thereof and on the lower side thereof, an electric contact surface for electrically contacting the respective electrical connection terminal. Thereby, the advantage is achieved that the respective electrical connection terminal can be contacted electrically in an efficient manner. The electric contact surfaces can be formed by copper coatings of the respective comb tine.

According to an example, a corrosion protection can be provided on a surface of the respective comb tine and/or on a surface of the electric contact surface. For example, the surface of the respective comb tine and/or the surface of the electric contact surface is tin-coated, in particular with a layer thickness of 50 to 250 μm, in order to achieve corrosion protection.

In another advantageous example of the loop bridge, the electric contact surfaces cover the respective metal support part at least partially. Thereby, the advantage is achieved that the electric contact surfaces can be connected in an electrically conductive manner feedthrough the respective metal support part.

In another advantageous example of the loop bridge, the first comb tine and the second comb tine are connected to one another in an electrically conductive manner feedthrough an electric connection line, and the electric connection line is connected in an electrically conductive manner to the respective metal support parts. Thereby, the advantage is achieved that the electric signal can be looped through efficiently from the first electrical connection terminal to the second electrical connection terminal.

In another advantageous example of the loop bridge, the first comb tine and the second comb tine are connected to one another in an electrically conductive manner feedthrough an electric connection line, the printed circuit board has a plurality of printed circuit board layers, and the electric connection line is arranged between two successive printed circuit board layers of the plurality of printed circuit board layers. Thereby, the advantage is achieved that an electric strength of the loop bridge can be increased.

In another advantageous example of the loop bridge, the respective comb tines are rectangular or rounded. Thereby, the advantage is achieved that the respective comb tines can be inserted particularly easily into terminal bodies of the respective electrical connection terminals.

BRIEF DESCRIPTION OF DRAWINGS

Examples of the present disclosure are represented in the drawings and described in further detail below.

DETAILED DESCRIPTION

Figure 1:
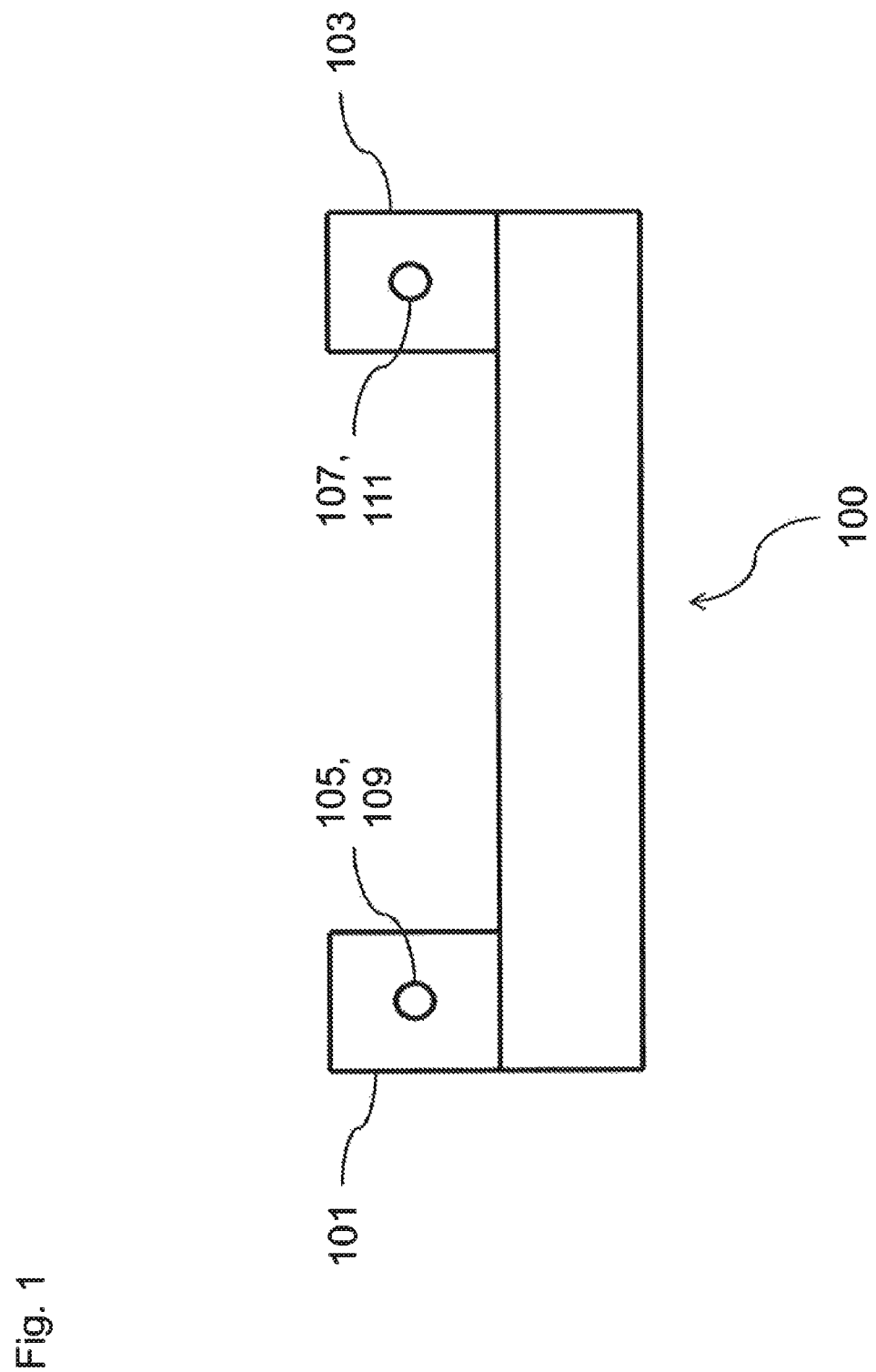
FIG. 1 shows a diagrammatic representation of a loop bridge according to an example.

FIG. 1 shows a diagrammatic representation of a loop bridge 100 according to an example. The loop bridge 100 has a first comb tine 101 and a second comb tine 103. Here, the first comb tine 101 has a first metal support part 105. Furthermore, the second comb tine 103 has a second metal support part 107. Here, the first metal support part 105 is formed by a first feedthrough 109, and the second metal support part 107 is formed by a second feedthrough 111.

The loop bridge 100 for looping-through an electric signal from a first electric module which has a first electrical connection terminal to a second electric module which has a second electrical connection terminal, wherein the first electrical connection terminal and the second electrical connection terminal in each case have a pressure piece, comprises a printed circuit board with a comb-like line structure, wherein the comb-like line structure has the following features: the first comb tine 101 and the second comb tine 103 which are electrically connected to one another, wherein the first comb tine 101 is insertable into the first electrical connection terminal, wherein the second comb tine 103 is insertable into the second electrical connection terminal, wherein the first comb tine 101 has the first metal support part 105 for the support of the pressure piece of the first electrical connection terminal, and wherein the second comb tine 103 has the second metal support part 107 for the support of the pressure piece of the second electrical connection terminal.

Furthermore, the loop bridge 100 can have a plurality of first comb tines 101 and the plurality of second comb tines 103, wherein the first comb tines 101 and the second comb tines 103 in each case are connected in an electrically conductive manner in pairs, and wherein the respective comb tines 101, 103 in each case have a respective metal support part 105, 107. For example, the plurality is 2, 3, 4, 5, 6, 7, 8, 9 or 10. Here, the plurality of electric signals can be looped through from a first electric module which has the plurality of first electrical connection terminals to a second module which has the plurality of second electrical connection terminals.

The respective electric module can be a sensor, an actuator or an electric device. Furthermore, the electric signal can be output by a current supply device or a voltage supply device. The electric signal can furthermore be a control signal. Furthermore, the respective electrical connection terminal can be a screw terminal or a spring terminal.

The printed circuit board can be a single-layer or a multi-layer printed circuit board. For example, the printed circuit board is manufactured from an FR-4 printed circuit board material. The first comb tine 101 and the second comb tine 103 can be electrically connected to one another feedthrough an electric connection line. Here, the electric connection line can be arranged on the printed circuit board or between two successive printed circuit board layers of the printed circuit board.

The respective metal support parts 105, 107 can be arranged centrally in the respective comb tine 101, 103. Furthermore, the respective metal support parts 105, 107 can extend transversely to a transverse direction of the respective comb tine 101, 103.

The respective feedthrough 109, 111 can be formed by a metallized bore hole in the respective comb tine 101, 103. For example, a diameter of the bore hole is 0.5 to 1.5 mm and the bore hole is metallized with copper.

According to an example, the respective feedthrough 109, 111 can be filled with an electrically conductive filler material. The electrically conductive filler material can be a cured metal paste. For example, the metal paste is a copper-resin compound or a silver-resin compound.

Figure 2:
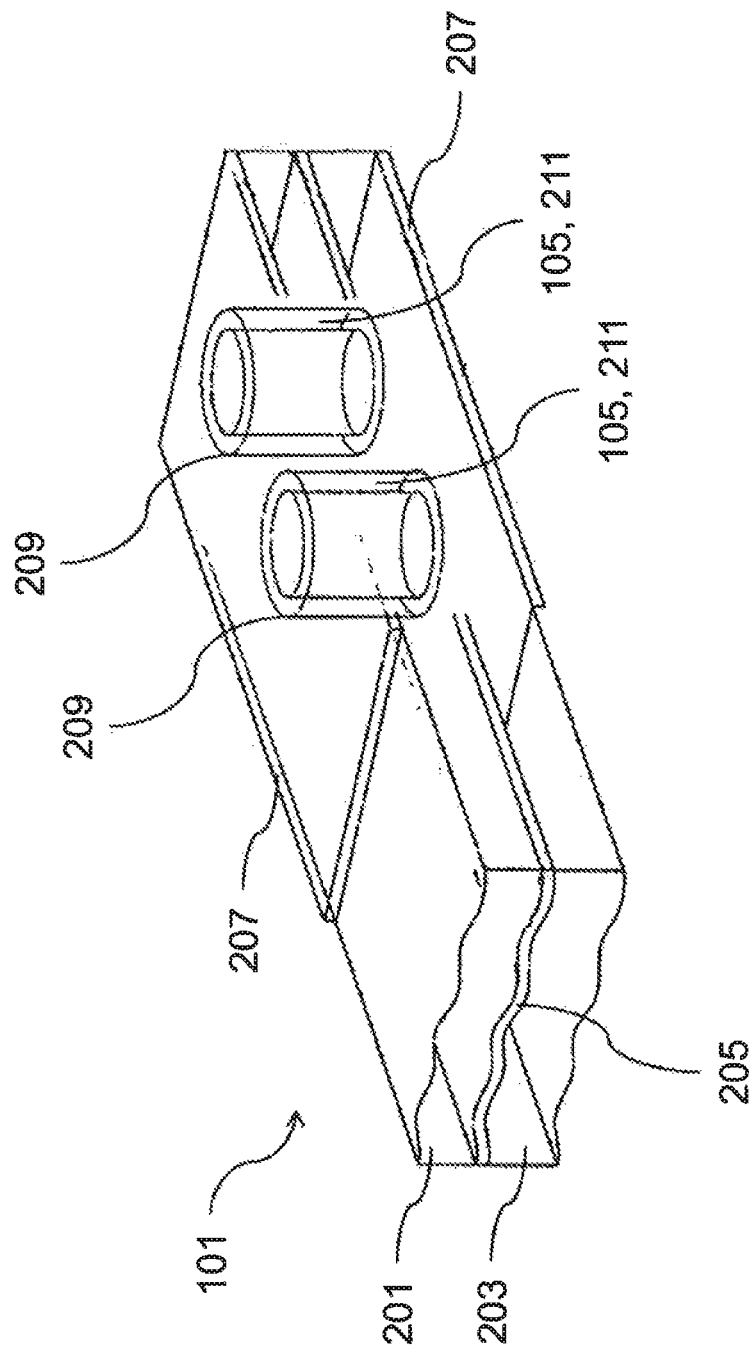
FIG. 2 shows a sectional view of a first comb tine according to an example.

FIG. 2 shows a cross-sectional view of the first comb tine 101 according to an example. The first comb tine 101 has a first printed circuit board layer 201 and a second printed circuit board layer 203, wherein, between the first printed circuit board layer 201 and the second printed circuit board layer 203, an electric connection line 205 is arranged, which is formed by a vertical conductive layer. Furthermore, the first comb tine 101, on the upper side thereof and on the lower side thereof, has an electric contact surface 207 in each case. The first comb tine 101 furthermore has first apertures 209, into which first metal support parts 105 in the form of metal sleeves 211 are inserted. The first apertures 209 are arranged centrally in the first comb tine 101 and extend transversely to a transverse direction of the first comb tine 101. Here, the electric contact surfaces 207 can cover the metal sleeves 211 at least partially in order to establish an electrically conductive connection between the electric contact surfaces 207 and the metal sleeves 211. Furthermore, the metal sleeves 211, on the upper side and the lower side of the first comb tine 101, can in each case form a support ring.

The first apertures 209 have circular cross-sectional areas. For example, the first apertures 209 are formed by bore holes having a diameter of 0.5 to 1.5 mm. The outer diameter of the metal sleeves 211 can furthermore be selected in such a manner that the metal sleeves 211 close off flush with the first apertures 209. Furthermore, the metal sleeves 211 can be manufactured out of copper. The electric contact surfaces 207 can furthermore have a thickness of 50 to 500 μm in each case. By means of the electric contact surfaces 207, an electric contacting of the first electrical connection terminal can furthermore be achieved. The respective printed circuit board layers 201, 203 can furthermore be manufactured out of an insulation material, for example, an FR-4 printed circuit board material.

According to an example, instead of the metal sleeves 211, metal cylinders can be arranged in the first apertures 209.

According to another example, the electric connection line 205 can be connected in an electrically conductive manner to the electric contact surfaces 207 feedthrough the metal sleeves 211.

Figure 3:
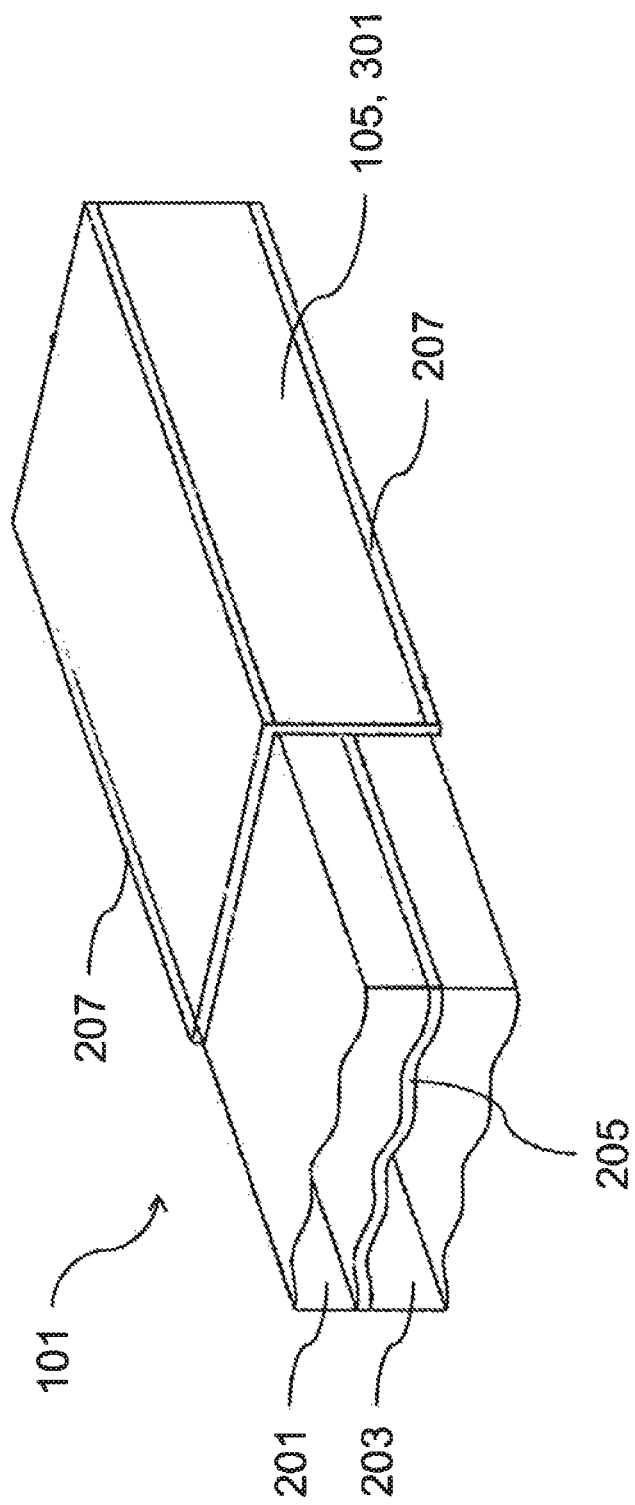
FIG. 3 shows a perspective view of a first comb tine according to another example.

FIG. 3 shows a perspective view of the first comb tine 101 according to another example. The first comb tine 101 comprises the first printed circuit board layer 201 and the second printed circuit board layer 203, wherein, between the first printed circuit board layer 201 and the second printed circuit board layer 203, the electric connection line 205 is arranged, which is formed by a vertical conductive layer. Furthermore, the first comb tine 101, on the upper side thereof and on the lower side thereof, has the electric contact surface 207. On a side wall of the first comb tine 101, a first metal support part 105 in the form of a metal coating 301 is arranged. The metal coating 301 partially covers the side wall of the first comb tine 101. Furthermore, the metal coating 301 can form a vertical conductive layer or a metal contact surface. The metal coating 301 can furthermore be a copper coating. For example, a thickness of the metal coating 301 is 50 to 500 μm.

The metal coating 301 extends from the upper side to the lower side of the first comb tine 101. Therefore, the pressure piece of the first electrical connection terminal can be supported by means of the metal coating 301.

According to an example, the first comb tine 101 can have a plurality of different metal support parts 105. For example, the first comb tine 101 has a first feedthrough 109, a first feedthrough 109 filled with an electrically conductive filler material, a first aperture 209 into which a metal sleeve 211 is inserted, a first aperture 209 into which a metal cylinder is inserted, and/or a metal coating 301 which is covered partially by a side wall of the first comb tine 101.

Figure 4:
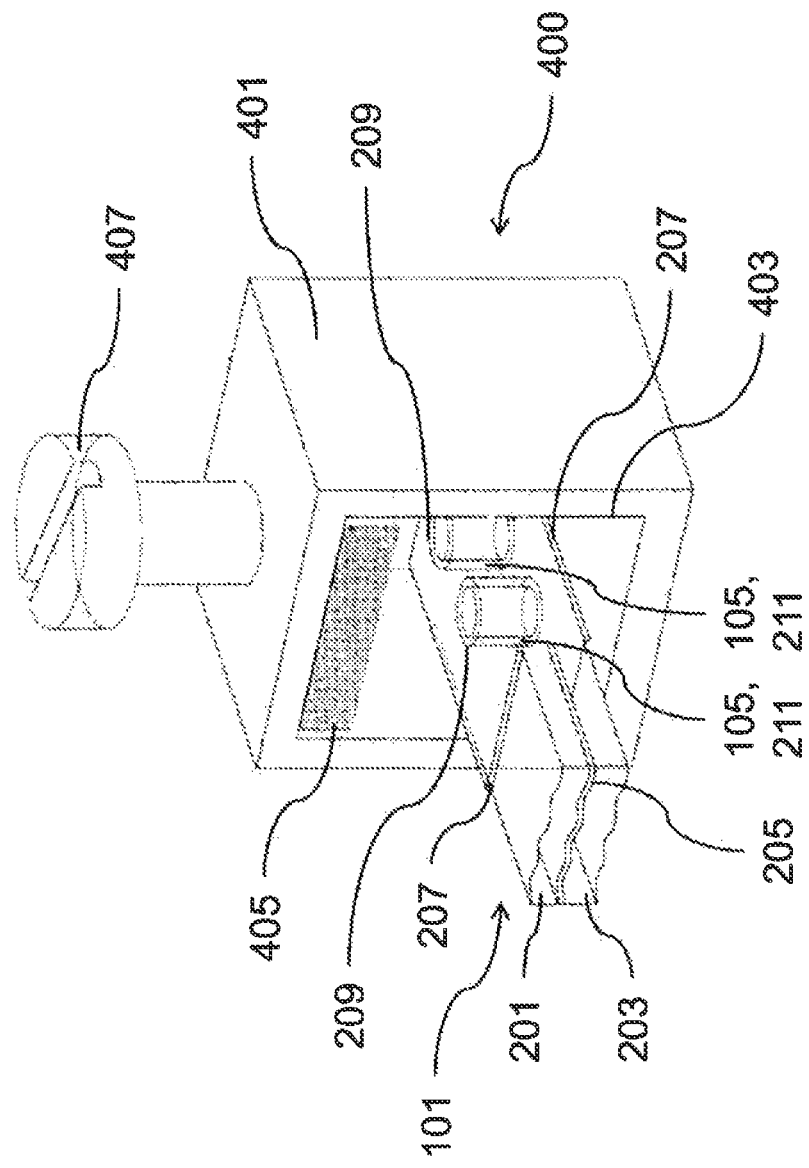
FIG. 4 shows an arrangement with a first comb tine and a first electrical connection terminal.

FIG. 4 shows an arrangement with a first comb tine 101 and a first electrical connection terminal 400. The comb tine 101 shown in FIG. 4 has the concrete features of the example of the first comb tine 101 which is shown in FIG. 2. The first electrical connection terminal 400 has a terminal body 401 with an opening 403, by which the first comb tine 101 is introduced or inserted partially into the terminal body 401. Furthermore, the electrical connection terminal 400 has a pressure piece 405 which can be pressed by means of a screw 407 against the first comb tine 101, in order to screw or fasten the first comb tine 101 in the first electrical connection terminal 400.

According to an example, the respective comb tines 101, 103 can form connection teeth or contact teeth.

According to another example, by means of the respective metal support parts 105, 107, the forces occurring during the screwing of the respective comb tines 101, 103 into the respective electrical connection terminals 400 can be absorbed, and thereby a load can be removed from the respective printed circuit board layers 201, 203 or from an insulation material of the printed circuit board.

According to another example, the respective metal support parts 105, 107 can be inserted sleeves, in particular metal sleeves 211 inserted in the respective comb tines 101, 103.

According to another example, the respective metal support parts 105, 107 can be formed by respective feedthroughs 109, 111, in particular by respective feedthroughs 109, 111 of the respective comb tines 101, 103.

According to another example, the respective metal support parts 105, 107 can be formed by respective feedthroughs 109, 111, in particular by respective feedthroughs 109, 111 of the respective comb tines 101, 103, which are filled with an electrically conductive filler material, such as a cured metal paste.

According to another example, the respective comb tines 101, 103 can be provided laterally with metal contact surfaces, in particular with metal coatings 301, feedthrough which forces can be absorbed.

All the features explained and shown in connection with individual examples of the disclosure can be provided in different combinations in the subject matter according to the disclosure, in order to implement at the same time the advantageous effects thereof.

LIST OF REFERENCE NUMBERS

100 Loop bridge
101 First comb tine
103 Second comb tine
105 First metal support part
107 Second metal support part
109 First feedthrough
111 Second feedthrough
201 Printed circuit board layer
203 Printed circuit board layer
205 Electric connection line
207 Electric contact surface
209 First aperture
211 Metal sleeve
301 Metal coating
400 First electrical connection terminal
401 Terminal body
403 Opening
405 Pressure piece
407 Screw

What is claimed is:

1. A loop bridge for looping-through an electric signal, comprising:
a first electric module comprising a first electrical connection terminal, wherein the electric signal loops through the first electric module to a second electric module comprising a second electrical connection terminal, wherein the first electrical connection terminal and the second electrical connection terminal each have a pressure piece; and
a printed circuit board with a comb-like line structure, wherein the comb-like line structure comprises:
a first comb tine, wherein the first comb tine is configured to be inserted into the first electrical connection terminal, and wherein the first comb tine comprises a first metal support part configured to support the pressure piece of the first electrical connection terminal; and
a second comb tine electrically connected to the first comb tine, wherein the second comb tine is configured to be inserted into the second electrical connection terminal, and wherein the second comb tine comprises a second metal support part configured to support the pressure piece of the second electrical connection terminal;
wherein the first comb tine and the second comb tine are connected to one another in an electrically conductive manner through an electric connection line; and
wherein the printed circuit board comprises a plurality of printed circuit board layers, and wherein the electric connection line is arranged between two successive printed circuit board layers of the plurality of printed circuit board layers.

2. The loop bridge according to claim 1, wherein the first comb tine comprises a first aperture, wherein the first metal support part is disposed in the first aperture, and wherein the second comb tine comprises a second aperture, wherein the second metal support part is disposed in the second aperture.

3. The loop bridge according to claim 2, wherein the first and second apertures are arranged centrally in each of the respective comb tines.

4. The loop bridge according to claim 2, wherein the first and second apertures extend transversely to a transverse axis of each of the respective comb tines.

5. The loop bridge according to claim 1, wherein the first and second metal support parts are a metal sleeve or a metal cylinder.

6. The loop bridge according to claim 1, wherein the first and second metal support parts are each a feedthrough formed in each of the respective comb tines.

7. The loop bridge according to claim 6, wherein the feedthrough is filled with an electrically conductive filler material.

8. The loop bridge according to claim 6, wherein the feedthrough is arranged centrally in each of the respective comb tines.

9. The loop bridge according to claim 1, wherein the first and second metal support parts at least partially, laterally engage around each of the respective comb tines, or wherein the first and second metal support parts comprise a side wall that at least partially covers a side wall of each of the respective comb tines.

10. The loop bridge according to claim 9, wherein the first and second metal support parts are formed by a metal coating of the side wall of each of the respective comb tines.

11. The loop bridge according to claim 1, wherein the first and second comb tines, on the top side thereof and on the bottom side thereof, each comprise an electric contact surface configured to electrically contact each of the respective electrical connection terminals.

12. The loop bridge according to claim 11, wherein the electric contact surfaces at least partially cover the first and second metal support parts.

13. The loop bridge according to claim 1, wherein the first and second comb tines are rectangular or rounded.

14. The loop bridge according to claim 1, wherein the electric connection line is connected in an electrically conductive manner to the respective metal support parts.

15. The loop bridge according to claim 1, wherein the pressure pieces of the first electrical connection terminal and the second electrical connection terminal is configured to be fastened to the respective comb tine by a screw.

16. The loop bridge according to claim 1, wherein the first and second comb tines form connection teeth.

17. The loop bridge according to claim 1, wherein the first and second electric module comprise a sensor, an actuator, or an electric device.

18. The loop bridge according to claim 1, wherein the first electrical connection terminal and the second electrical connection terminal comprise a screw terminal or a spring terminal.

* * * * *